United States Patent
Cho et al.

(10) Patent No.: US 10,119,671 B2
(45) Date of Patent: Nov. 6, 2018

(54) LIGHT EMITTING DEVICE AND VEHICULAR LAMP INCLUDING THE SAME

(71) Applicant: Seoul Semiconductor Co., Ltd., Ansan-si (KR)

(72) Inventors: Yang Sik Cho, Ansan-si (KR); Yoon Seop Lee, Ansan-si (KR); Dae Wook Kim, Ansan-si (KR); Da Hye Kim, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 15/577,288

(22) PCT Filed: May 24, 2016

(86) PCT No.: PCT/KR2016/005458
§ 371 (c)(1),
(2) Date: Nov. 27, 2017

(87) PCT Pub. No.: WO2016/190644
PCT Pub. Date: Dec. 1, 2016

(65) Prior Publication Data
US 2018/0149328 A1    May 31, 2018

(30) Foreign Application Priority Data

May 26, 2015  (KR) .................. 10-2015-0073159

(51) Int. Cl.
*F21S 43/14*    (2018.01)
*B60Q 1/26*    (2006.01)
(Continued)

(52) U.S. Cl.
CPC .............. *F21S 43/195* (2018.01); *B60Q 1/18* (2013.01); *B60Q 1/2607* (2013.01); *B60Q 1/34* (2013.01);
(Continued)

(58) Field of Classification Search
CPC ........ F21S 43/195; F21S 43/14; F21S 41/192; F21S 41/141; B60Q 1/34; B60Q 1/18; B60Q 1/2607
See application file for complete search history.

(56) References Cited

U.S. PATENT DOCUMENTS

| 7,525,248 B1 | 4/2009 | Fan |
| 2008/0087902 A1 | 4/2008 | Lee et al. |

(Continued)

FOREIGN PATENT DOCUMENTS

| KR | 10-1138945 | 4/2012 |

OTHER PUBLICATIONS

International Search Report dated Aug. 26, 2016, in International Application No. PCT/KR2016/005458.

(Continued)

*Primary Examiner* — Joseph L Williams
(74) *Attorney, Agent, or Firm* — H.C. Park & Associates, PLC

(57) ABSTRACT

The present disclosure relates to a light-emitting device and a vehicular lamp including the same. The light-emitting device may include a light-emitting unit and a sidewall. The light emitting unit may include a light-emitting element. The sidewall may surround a side of the light-emitting unit and adjoin the side of the light-emitting unit. The light-emitting element may include at least two light-emitting cells grown on a single growth substrate and may be electrically connected to one another.

19 Claims, 5 Drawing Sheets

(51) Int. Cl.
*F21S 43/19* (2018.01)
*B60Q 1/18* (2006.01)
*B60Q 1/34* (2006.01)
*F21S 41/141* (2018.01)
*F21S 41/19* (2018.01)
*H01L 27/02* (2006.01)
*F21Y 115/10* (2016.01)
*F21S 45/10* (2018.01)
*H01L 33/50* (2010.01)
*H01L 33/62* (2010.01)
*H01L 33/64* (2010.01)
*H01L 33/60* (2010.01)

(52) U.S. Cl.
CPC ........... *F21S 41/141* (2018.01); *F21S 41/192* (2018.01); *F21S 43/14* (2018.01); *F21S 45/10* (2018.01); *F21Y 2115/10* (2016.08); *H01L 27/0248* (2013.01); *H01L 33/502* (2013.01); *H01L 33/60* (2013.01); *H01L 33/62* (2013.01); *H01L 33/647* (2013.01); *H01L 2933/0091* (2013.01)

(56) References Cited

U.S. PATENT DOCUMENTS

2011/0101400 A1 5/2011 Chu et al.
2012/0097996 A1 4/2012 Lee et al.

OTHER PUBLICATIONS

Written Opinion dated Aug. 26, 2016, in International Application No. PCT/KR2016/005458.

LIGHT EMITTING DEVICE AND VEHICULAR LAMP INCLUDING THE SAME

CROSS-REFERENCE TO RELATED APPLICATIONS

This application is a national stage entry of International Application No. PCT/KR2016/005458, filed May 24, 2016, and claims priority from and the benefit of Korean Patent Application No. 10-2015-0073159, filed May 26, 2015, each of which is hereby incorporated by reference for all purposes as if fully set forth herein.

BACKGROUND

Field

Exemplary embodiments relate to a light emitting device and a vehicular lamp including the same, and, more particularly, to a light emitting device configured to provide high intensity light and a vehicular lamp including the same.

Discussion

A light emitting diode may refer to an inorganic semiconductor device that emits light through recombination of electrons and holes, and has been used in various fields including displays, automobile lamps, general lighting, and the like. Such a light emitting diode has various advantages, such as long lifespan, low power consumption, and rapid response. Accordingly, light emitting devices using a light emitting diode are expected to replace conventional light sources.

Conventional light emitting diodes typically emit light having a relatively narrow full width at half-maximum, and, as such, generally emit monochromatic light. Accordingly, in order to allow one light emitting module or light emitting device to emit various colors, light emitting diode packages configured to emit light of different colors must be mounted in a single module. Moreover, at least two light emitting diodes may be provided to allow a light emitting module to emit light having a predetermined illuminance or more. However, even in a structure enabling the light emitting module to emit light having a predetermined illuminance or more using at least two light emitting diodes, a dark shadow is typically be formed at a location corresponding to a space between the light emitting diodes.

The above information disclosed in this section is only for understanding the background of the inventive concepts, and, therefore, may contain information that does not form prior art.

SUMMARY

Some exemplary embodiments provide a light emitting device capable of emitting light having a determined illuminance or more while minimizing (or at least reducing) generation of a dark shadow.

Some exemplary embodiments provide a vehicular lamp including a light emitting device capable of emitting light having a determined illuminance or more while minimizing (or at least reducing) generation of a dark shadow.

Additional aspects will be set forth in the detailed description which follows, and, in part, will be apparent from the disclosure, or may be learned by practice of the inventive concepts.

According to some exemplary embodiments, a light emitting device includes a light emitting unit and a sidewall. The light emitting unit includes a light emitting element. The sidewall surrounds a side surface of the light emitting unit and adjoins the side surface of the light emitting unit. The light emitting element includes at least two light emitting cells grown on a single growth substrate and are electrically connected to each other.

The light emitting device may further include a substrate supporting the light emitting unit and the sidewall. The substrate may include a first electrode and a second electrode electrically connected to the light emitting element.

The light emitting unit may include a wavelength converter disposed on the light emitting element. The wavelength converter may be configured to convert a wavelength of light emitted from the light emitting element.

The light emitting unit may include a pad electrode disposed on a lower surface of the light emitting element.

The at least two light emitting cells may be electrically connected to each other in series.

Each of the at least two light emitting cells may include a light emitting structure including an n-type semiconductor layer, a p-type semiconductor layer, and an active layer interposed between the n-type semiconductor layer and the p-type semiconductor layer. The at least two light emitting cells may be electrically connected to each other by a connection electrode formed on an upper surface of the light emitting structure.

The connection electrode may be electrically connected to an n-type semiconductor layer of one of the at least two light emitting cells and a p-type semiconductor layer of another one of the at least two light emitting cells.

The sidewall may include a protruding portion formed on an upper edge of the sidewall. An upper portion of the sidewall may be inwardly inclined from a location of the protruding portion on the sidewall.

According to some exemplary embodiments, a vehicular lamp includes a combination lamp including a light emitting device. The light emitting device may including a light emitting unit and a sidewall. The light emitting unit includes a light emitting element. The sidewall surrounds a side surface of the light emitting unit and adjoins the side surface of the light emitting unit. The light emitting element includes at least two light emitting cells grown on a single growth substrate and are electrically connected to each other.

The vehicular lamp may include a substrate supporting the light emitting unit and the sidewall.

The vehicular lamp may further include a main lamp adjacent to the combination lamp. The combination lamp may provide an illuminating function different than the main lamp.

According to various exemplary embodiments, a light emitting device can emit light having the same or higher illuminance than a conventional light emitting device including at least two light emitting diode chips. In one or more exemplary embodiments, the light emitting device employs one light emitting diode chip including at least two light emitting cells to minimize (or reduce) generation of a dark shadow between the light emitting cells.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
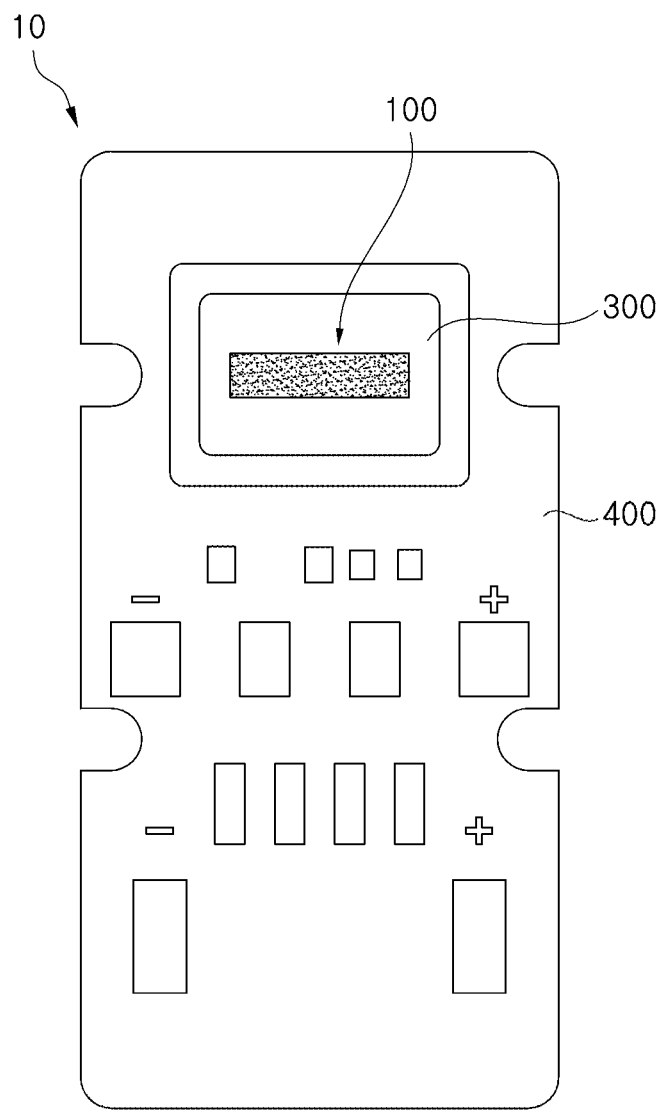
FIG. 1 is a plan view of a light emitting device according to some exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be implemented in another exemplary embodiment without departing from the spirit and the scope of the disclosure.

Unless otherwise specified, the illustrated exemplary embodiments are to be understood as providing exemplary features of varying detail of some exemplary embodiments. Therefore, unless otherwise specified, the features, components, modules, layers, films, panels, regions, aspects, etc. (hereinafter individually or collectively referred to as "elements"), of the various illustrations may be otherwise combined, separated, interchanged, and/or rearranged without departing from the spirit and the scope of the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element is referred to as being "on," "connected to," or "coupled to" another element, it may be directly on, connected to, or coupled to the other element or intervening elements may be present. When, however, an element is referred to as being "directly on," "directly connected to," or "directly coupled to" another element, there are no intervening elements present. To this end, the term "connected" may refer to physical, electrical, and/or fluid connection. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one element's relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. In this manner, regions illustrated in the drawings are schematic in nature and shapes of these regions may not illustrate the actual shapes of regions of a device, and, as such, are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2A:
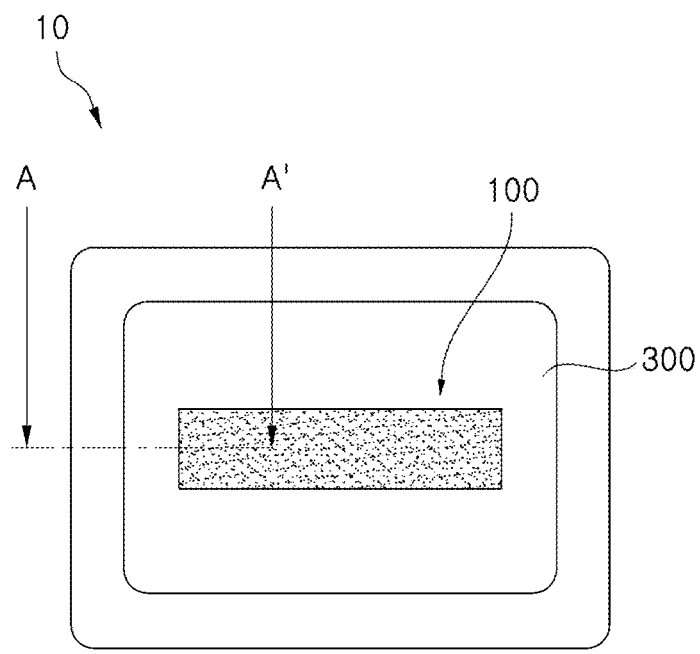
FIGS. 2A and 2B show a light emitting unit of the light emitting device of FIG. 1 according to some exemplary embodiments.
Figure 2B:
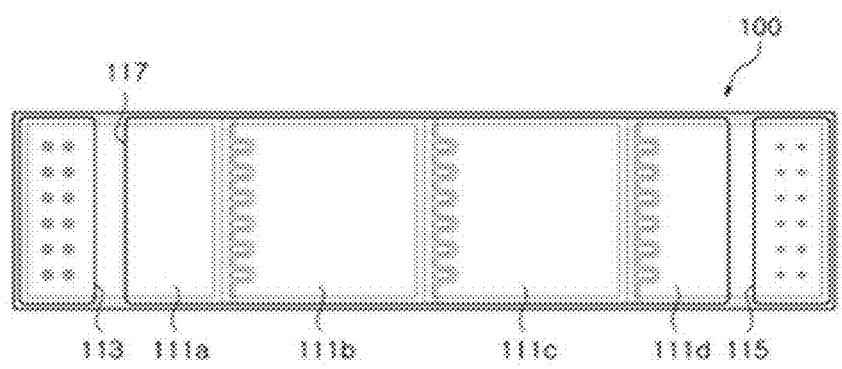
Figure 3:
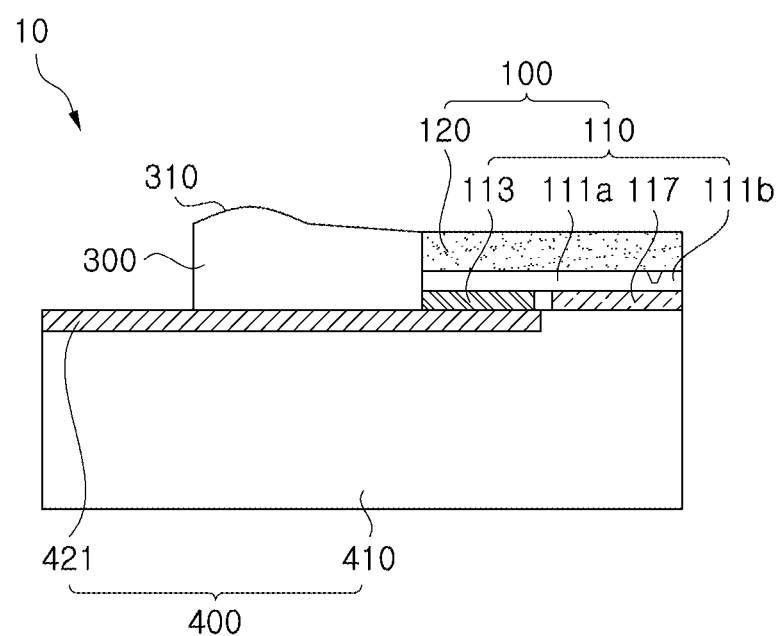
FIG. 3 is a cross-sectional view taken along sectional line A-A' of FIG. 2A according to some exemplary embodiments.

FIG. 1 is a plan view of a light emitting device according to some exemplary embodiments. FIG. 2A is a plan view of a light emitting unit of the light emitting device of FIG. 1 according to some exemplary embodiments. FIG. 2B is an enlarged plan view of the light emitting unit of FIG. 2A according to some exemplary embodiments. FIG. 3 is a cross-sectional view taken along sectional line A-A' of FIG. 2A according to some exemplary embodiments.

Referring to FIG. 1, a light emitting device 10 according to some exemplary embodiments includes a light emitting unit 100, a sidewall 300, and a substrate 400.

The substrate 400 may be placed (or disposed) on the bottom of the light emitting device 10, and serves to support the light emitting unit 100 and the sidewall 300. The substrate 400 may be an insulating or conductive substrate. It is also contemplated that the substrate 400 may be a printed circuit board (PCB) having a conductive pattern. For instance, the conductive pattern may be formed on the PCB. When the substrate 400 is an insulating substrate, the substrate 400 may include at least one of a polymer material and a ceramic material, for example, a ceramic material having relatively good thermal conductivity, such as AlN.

The substrate 400 may include a base 410, a first electrode 421, and a second electrode.

The base 410 may serve to support the substrate 400, the first electrode 421, and the second electrode. The base 410 may include a ceramic material having good thermal conductivity, such as AlN, or a metallic material, such as Cu. In addition, as shown in FIG. 3, the base 410 may be formed with grooves at locations corresponding to the first electrode 421 and the second electrode. The grooves may partially protrude to contact a lower surface of the light emitting unit 100.

The first electrode 421 and the second electrode may be formed in the grooves of the base 410, and may be insulated from each other. In addition, an insulating portion may be interposed between the base 410 and each of the first electrode 421 and the second electrode such the first electrode 421 and the second electrode can be insulated from the base 410. The first electrode 421 and the second electrode may be electrically connected to the light emitting unit 100 disposed on the substrate 400, and may also be electrically connected to an external power source to supply electric power to the light emitting unit 100.

In order to allow the first electrode 421 and the second electrode to be electrically connected to an external power source, the first electrode 421 and the second electrode may be partially exposed to the outside. By way of example, the first electrode 421 and the second electrode may be exposed through a side surface of the base 410.

As described above, the first electrode 421 and the second electrode may be insulated from the base 410. In a case where the base 410 includes a metallic material, the first electrode 421 and the second electrode may be insulated from the base 410 through, for instance, an insulating portion; however, any other suitable technique may be utilized. In a case where the base 410 includes a ceramic material or a non-conductive material, the insulating portion for insulating the first electrode 421 and the second electrode from the base 410 can be omitted.

According to one or more exemplary embodiments, when the base 410 includes a metallic material, the insulating portion may be formed on lower surfaces of the grooves formed on the base 410, and each of the first electrode 421 and the second electrode may be formed on the insulating portion such that side surfaces of the grooves of the base 410 are separated a determined distance or more from the first electrode 421 and the second electrode. With this structure, the first electrode 421 and the second electrode can be insulated from the base 410.

In some exemplary embodiments, the substrate 400 may be omitted.

With continued reference to FIGS. 2A, 2B, and 3, the light emitting device 10 includes the light emitting unit 100, which includes a light emitting element 110 and a wavelength converter 120.

The light emitting element 110 may include a plurality of light emitting cells, such as first to fourth light emitting cells 111a, 111b, 111c, 111d. The light emitting element 110 may further include a first pad electrode 113, a second pad electrode 115, and a heat dissipation pad 117.

Each of the first to fourth light emitting cells 111a, 111b, 111c, 111d may include an n-type semiconductor layer, a p-type semiconductor layer, and an active layer interposed between the n-type semiconductor layer and the p-type semiconductor layer. With this structure, the first to fourth light emitting cells 111a, 111b, 111c, 111d can emit light upon application of power thereto. The first pad electrode 113 may be electrically connected to the first light emitting cell 111a, and the second pad electrode 115 may be electrically connected to the fourth light emitting cell 111d. In one or more exemplary embodiments, the first to fourth light emitting cells 111a, 111b, 111c, 111d may be electrically connected to one another in series.

The first to fourth light emitting cells 111a, 111b, 111c, 111d may be electrically connected to one another, as shown in FIG. 2B. Accordingly, electric power supplied through the first and second pad electrodes 113, 115 can be supplied to each of the first to fourth light emitting cells 111a, 111b, 111c, 111d. For each of the first to fourth light emitting cells 111a, 111b, 111c, 111d, an n-type semiconductor layer, an active layer, and a p-type semiconductor layer may be grown on a growth substrate, and the n-type semiconductor layer of the first light emitting cell 111a may be electrically connected to the p-type semiconductor layer of the second light emitting cell 111b by a connection electrode. In addition, the n-type semiconductor layer of the second light emitting cell 111b may be electrically connected to the p-type semiconductor layer of the third light emitting cell 111c by the connection electrode, and the n-type semiconductor layer of the third light emitting cell 111c may be electrically connected to the p-type semiconductor layer of the fourth light emitting cell 111d by the connection electrode. As such, the first to fourth light emitting cells 111a, 111b, 111c, 111d may be electrically connected to one another.

The connection electrode may be electrically connected to the n-type semiconductor layer and the p-type semiconductor layer through a hole formed in an insulation layer, which insulates the n-type semiconductor layer from the p-type semiconductor layer. That is, although the first to fourth light emitting cells 111a, 111b, 111c, 111d emit light upon application of electric power thereto, the first to fourth light emitting cells 111a, 111b, 111c, 111d constitute one light emitting element 110 formed on the same, e.g., single, growth substrate. Although the light emitting element 110 has been described and illustrated as including four light emitting cells 111a, 111b, 111c, 111d, the number of light emitting cells in the light emitting element 110 can be changed. In addition, the shape and arrangement of the light emitting cells 111a, 111b, 111c, 111d can be modified in various ways.

The first and second pad electrodes 113, 115 may be electrically connected to the n-type semiconductor layer of the first light emitting cell 111a and the p-type semiconductor layer of the fourth light emitting cell 111d, respectively, or vice versa. For instance, the first and second pad electrodes 113, 115 may extend downwards, and, thus, may be placed (or disposed) at a lower side of the light emitting element 110. As another example, the first and second pad electrodes 113, 115 may be generally flush with a lower surface of the light emitting element 110, or may be placed above the lower surface of the light emitting element 110. In a structure including the first and second pad electrodes 113, 115 being placed above the lower surface of the light emitting element 110, the light emitting element 110 may be formed with grooves, and the first and second pad electrodes 113, 115 may be formed in the grooves.

The light emitting element 110 may have any shape without limitation. By way of example, the light emitting element 110 may be a flip-chip semiconductor light emitting element 110 in which the first and second pad electrodes 113, 115 are placed on one surface of the light emitting element 110. The first and second pad electrodes 113, 115 may be electrically connected to the first electrode 421 and the second electrode of the substrate 400, respectively, whereby electric power can be supplied to the light emitting element 110 through the first electrode 421 and the second electrode.

According to some exemplary embodiments, the heat dissipation pad 117 may be interposed between the first and second pad electrodes 113, 115. The heat dissipation pad 117 is separated a determined distance from the first and second pad electrodes 113, 115 so as to be electrically insulated therefrom. As shown in FIG. 2B, the heat dissipation pad 117 may be formed to cover part of the first and fourth light emitting cells 111a, 111d and the entirety of the second and third light emitting cells 111b, 111c. For instance, the first and second pad electrodes 113, 115 and the heat dissipation pad 117 may be formed to cover most of the light emitting element 110, thereby allowing heat generated from the light emitting element 110 to be effectively transferred to the substrate 400, dissipated, and the like.

The wavelength converter 120 may be disposed on the light emitting element 110 to cover at least part of an upper surface of the light emitting element 110. For instance, the light emitting element 110 may be disposed between the substrate 400 and the wavelength converter 120. Furthermore, the wavelength converter 120 may have substantially the same area as the upper surface of the light emitting element 110. Accordingly, as shown in, for instance, FIG. 3, a side surface of the light emitting element 110 may be substantially flush with a side surface of the wavelength converter 120.

The wavelength converter 120 may include phosphors and a supporter containing the phosphors. The wavelength converter 120 may include various kinds of phosphors known to those skilled in the art, for example, garnet-type phosphors, aluminate phosphors, sulfide phosphors, oxynitride phosphors, nitride phosphors, fluoride phosphors, silicate phosphors, and the like, and may be configured to emit white light through wavelength conversion of light emitted from the light emitting element 110. For example, when the light emitting element 110 emits light having a peak wavelength in the blue wavelength band, the wavelength converter 120 may include phosphors that emit light (for example, green light, red light, or yellow light) having a longer peak wavelength than blue light.

The supporter may include at least one of a polymer resin, a ceramic material, such as glass, and the like. The phosphors may be disposed in the supporter. For example, when the supporter is formed of an epoxy resin or an acryl resin, the wavelength converter 120 may be formed by depositing a resin containing the phosphors on the light emitting element 110, followed by curing the resin.

Additionally or alternatively, the wavelength converter 120 may include a single crystal material. The wavelength converter 120 including the single crystal material may be provided in the form of a phosphor sheet, and such a phosphor-sheet type wavelength converter 120 may be composed of single crystal phosphors. Light having passed through the wavelength converter 120 including the single crystal phosphors may generally have constant color coordinates. For example, the single crystal phosphors may be single crystal YAG:Ce. Such a phosphor-sheet type wavelength converter 120 may be bonded to the upper surface of the light emitting element 110.

Although the wavelength converter 120 has been described and illustrated as being formed on the upper surface of the light emitting element 110, that is, on the entirety of upper surfaces of the first to fourth light emitting cells 111a, 111b, 111c, 111d, the wavelength converter 120 may include a plurality of wavelength converters. For example, the wavelength converter 120 may include a first wavelength converter formed on the upper surface of the first light emitting cell 111a and a second wavelength converter formed on the upper surface of the second light emitting cell 111b. The plural wavelength converters may contain different phosphors and some of the wavelength converters may be free from phosphor and may include a light scattering agent such as $TiO_2$.

According to some exemplary embodiments, the wavelength converter 120 may be formed in a larger area than the upper surface of the light emitting element 110 and may cover the side surface (or a portion thereof) of the light emitting element 110.

The sidewall 300 may cover the side surface of the light emitting element 110 and may also cover the side surface of the wavelength converter 120. With this structure, the sidewall 300 may contact the light emitting element 110 and may also cover part of the lower surface of the light emitting element 110, as needed, such that the side surfaces of the first and second pad electrodes 113, 115 are surrounded by the sidewall 300.

As shown in FIG. 3, the sidewall 300 may have a protruding portion 310 at an edge thereof, and may be inclined inwardly from the protruding portion 310. The upper surface of the protruding portion 310 may arcuately protrude from an upper surface of the sidewall 300.

According to one or more exemplary embodiments, the protruding portion 310 may be used during formation of the sidewall 300. First, a portion of the sidewall 300 including the protruding portion 310 may be formed and the remaining portion of the sidewall 300 may be formed by molding an inner side of the portion of the sidewall 300. Here, the protruding portion 310 can prevent a molding material from flowing outside the previously formed portion of the sidewall 300 during molding of the remaining portion of the sidewall 300.

The sidewall 300 can support the light emitting unit 100 while protecting the light emitting unit 100 from an external environment. The sidewall 300 can also act (or function) to reflect light. The sidewall 300 is formed at an outer periphery of the light emitting device 10 to collect light emitted from the light emitting unit 100 in an upward direction. It should be understood that other implementations are also possible. A beam angle of light emitted from the light emitting unit 100 can be adjusted by adjusting reflectivity or light transmittance of the sidewall 300.

The sidewall 300 may include at least one of an insulating polymer material and ceramic material, and may further include fillers capable of reflecting and/or scattering light. The sidewall 300 may have permeability, semi-permeability, or reflectivity with respect to light. For example, the sidewall 300 may include a polymer resin, such as a silicone resin, an epoxy resin, a polyimide resin, a urethane resin, and the like.

The fillers may be evenly dispersed in the sidewall 300. The fillers may be selected from any materials capable of reflecting or scattering light without limitation, and may include, for example, at least one of titanium oxide ($TiO_2$), silicon oxide ($SiO_2$), zirconium oxide ($ZrO_2$), and the like. Reflectivity or scattering capability of the sidewall 300 can be adjusted by adjusting the kind or concentration of the fillers.

The light emitting device 10 according to various exemplary embodiments may further include a protection device. The protection device may be disposed inside the sidewall 300 and may include, for example, a Zener diode. The protection device may be electrically connected to the light emitting element 110 to prevent (or at least reduce the potential for) failure of the light emitting element 110 due to electrostatic discharge or the like.

Figure 4:
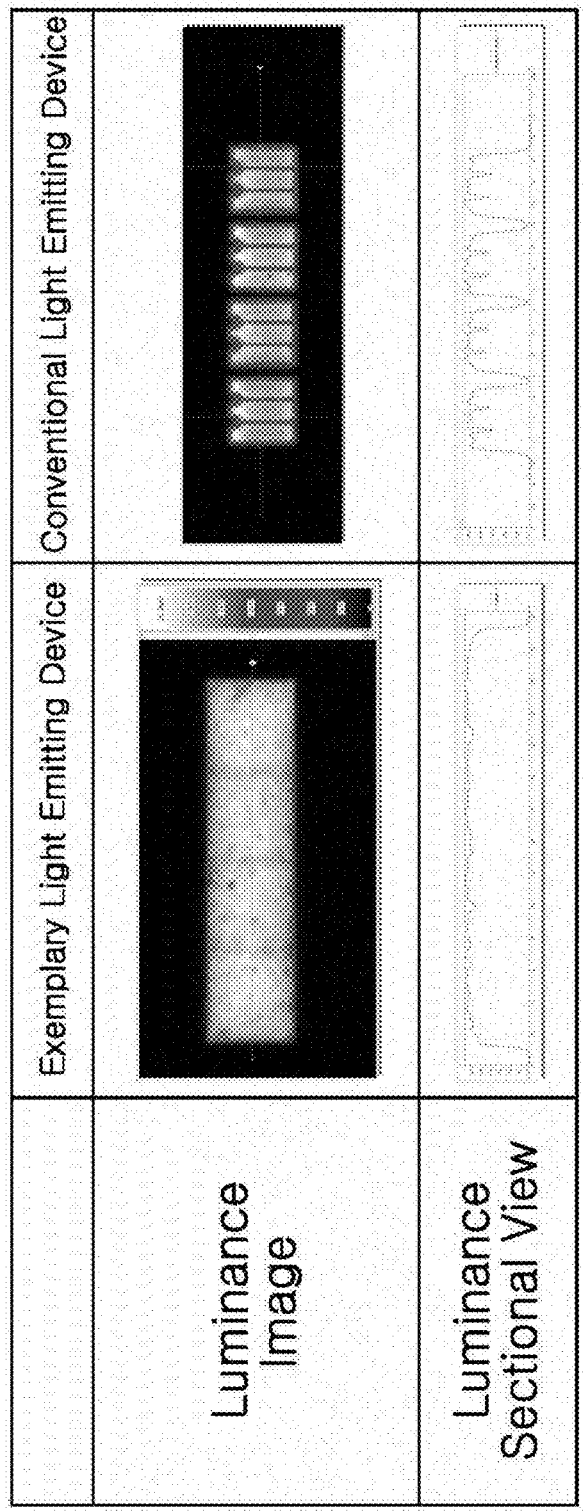
FIG. 4 is a graph comparing an exemplary light emitting device with a conventional light emitting device.

FIG. 4 is a graph comparing an exemplary light emitting device with a conventional light emitting device.

Referring to FIG. 4, comparing a luminance image of light emitted from the light emitting unit 110 included in the light emitting device 10 with that of light emitted from a conventional (or typical) light emitting device including four light emitting elements, it can be seen that light emitted from the light emitting unit 110 does not form a dark shadow between the light emitting cells, e.g., the first to fourth light emitting cells 110a, 110b, 110c, 110d. In addition, it can be seen from the luminance sectional views that the light emitting device 10 provides uniform illuminance without forming a dark shadow between the light emitting cells, e.g., the first to fourth light emitting cells 110a, 110b, 110c, 110d.

The light emitting device 10 according to some exemplary embodiments may be applied to various devices, for example, a vehicular lamp 20. The vehicular lamp 20 including one or more light emitting devices 10 will be described with reference to FIG. 5.

Figure 5:
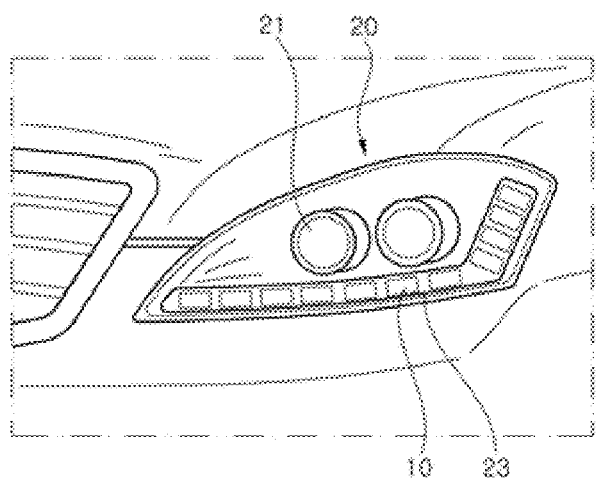
FIG. 5 is a front view of a vehicular lamp including a light emitting device according to some exemplary embodiments.

FIG. 5 is a front view of a vehicular lamp according to some exemplary embodiments.

Referring to FIG. 5, a vehicular lamp 20 according to some exemplary embodiments may include a combination lamp 23 and may further include a main lamp 21. The vehicular lamp 20 may be applied to various parts of vehicles, such as headlights, rear lamps, side lamps, and the like.

The main lamp 21 may be a main lighting fixture of the vehicular lamp 20. For example, when the vehicular lamp 20 is used as a headlight, the main lamp 21 may act (or function) as a headlamp illuminating an area in front of a vehicle.

The combination lamp 23 may have at least two functions. For example, when the vehicular lamp 20 is used as the headlight, the combination lamp 23 may act as a daytime running light (DRL) and as a turn signal light. In this manner, the combination lamp 23 may provide a different illumination function than the main lamp 21.

The combination lamp 23 including the light emitting device 10 according to some exemplary embodiments employs one light emitting element 110 including a plurality of light emitting cells (e.g., first and second light emitting cells 111a, 111b or any other number of light emitting cells) thereby realizing uniform light emission through the light emitting device 10 by minimizing (or at least reducing) generation of a dark shadow between the light emitting cells (e.g., first to fourth light emitting cells 111a, 111b, 111c, 111d) as compared with a combination lamp including a plurality of individual light emitting elements therein.

Although certain exemplary embodiments and implementations have been described herein, other embodiments and modifications will be apparent from this description. Accordingly, the inventive concepts are not limited to such embodiments, but rather to the broader scope of the presented claims and various obvious modifications and equivalent arrangements.

The invention claimed is:

1. A vehicular lamp comprising:
   a combination lamp; and
   a main lamp,
   wherein at least one of the combination lamp and the main lamp comprises:
      a light emitting unit;
      a sidewall surrounding a side surface of the light emitting unit and adjoining the side surface thereof; and
      a substrate disposed at a lower side of the light emitting unit and supporting the light emitting unit and the sidewall,
   wherein the light emitting unit comprises:
      a light emitting element comprising at least two light emitting cells;
      a wavelength converter disposed on the light emitting element and covering at least part of an upper surface of the light emitting element;
      a first pad electrode electrically connected to at least one of the light emitting cells; and
      a second pad electrode electrically connected to the other light emitting cell,
   wherein the sidewall has a protruding portion formed at an edge thereof,
   wherein the substrate comprises a base and first and second electrodes electrically connected to an external electrode to supply electric power to the light emitting unit, the first electrode and the second electrode being at least partially exposed,
   wherein the at least two light emitting cells are electrically connected to each other and each comprise an n-type semiconductor layer, a p-type semiconductor layer, and an active layer interposed between the n-type semiconductor layer and the p-type semiconductor layer.

2. The vehicular lamp according to claim 1, wherein the combination lamp has at least two functions.

3. The vehicular lamp according to claim 2, wherein the combination lamp acts as a daytime running light and a turn signal light.

4. The vehicular lamp according to claim 1, wherein the main lamp is a headlight.

5. The vehicular lamp according to claim 1, wherein the sidewall has an inclination gradually increasing from an inner side thereof to the protruding portion thereof.

6. The vehicular lamp according to claim 1, wherein the wavelength converter has the same area as the upper surface of the light emitting element.

7. The vehicular lamp according to claim 1, wherein a side surface of the wavelength converter is flush with a side surface of the light emitting element.

8. The vehicular lamp according to claim 1, wherein the light emitting element comprises first to fourth light emitting cells, the first to fourth light emitting cells being electrically connected to each other in series.

9. The vehicular lamp according to claim 8, wherein the n-type semiconductor layer of the first light emitting cell is electrically connected to the first pad electrode.

10. The vehicular lamp according to claim 8, wherein the p-type semiconductor layer of the fourth light emitting cell is electrically connected to the second pad electrode.

11. The vehicular lamp according to claim 9, wherein a heat dissipation pad is further disposed between the first and second pad electrodes so as to be electrically insulated from the first and second pad electrodes.

12. The vehicular lamp according to claim 10, wherein a heat dissipation pad is further disposed between the first and second pad electrodes so as to be electrically insulated from the first and second pad electrodes.

13. The vehicular lamp according to claim 11, wherein the heat dissipation pad partially covers the first and fourth light emitting cells.

14. The vehicular lamp according to claim 13, wherein the heat dissipation pad covers the entirety of the second and third light emitting cells.

15. The vehicular lamp according to claim 1, wherein a heat dissipation pad is further disposed between the first and second pad electrodes so as to be electrically insulated from the first and second pad electrodes.

16. The vehicular lamp according to claim 1, wherein the light emitting cells are electrically connected to each other via a connection electrode.

17. The vehicular lamp according to claim 16, wherein the connection electrode is electrically connected to the light emitting cells through a hole formed in an insulation layer insulating the light emitting cells from each other.

18. The vehicular lamp according to claim 1, wherein the base is formed with grooves, and the first and second electrodes are formed in the grooves, respectively.

19. The vehicular lamp according to claim 18, wherein the base partially protrudes to contact a lower surface of the light emitting unit.

* * * * *